(12) United States Patent
Schlösser

(10) Patent No.: US 6,645,822 B2
(45) Date of Patent: Nov. 11, 2003

(54) METHOD FOR MANUFACTURING A SEMICONDUCTOR CIRCUIT SYSTEM

(75) Inventor: Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 10/062,940

(22) Filed: Jan. 31, 2002

(65) Prior Publication Data

US 2002/0102828 A1 Aug. 1, 2002

(30) Foreign Application Priority Data

Jan. 31, 2001 (DE) .......................... 101 04 265

(51) Int. Cl.$^7$ ............................................ H01L 21/20
(52) U.S. Cl. ............................ 438/396; 438/3; 438/48; 438/239; 438/244; 438/253; 438/689; 438/706; 257/68; 257/71; 257/298; 257/301; 257/303; 257/414; 257/421; 365/212; 365/213
(58) Field of Search .................. 438/396, 3, 239–253, 438/48, 689–704; 257/71, 68, 298–306, 414–42; 365/212–213

(56) References Cited

U.S. PATENT DOCUMENTS

| | | | |
|---|---|---|---|
| 5,496,759 A | | 3/1996 | Yue et al. |
| 5,500,386 A | * | 3/1996 | Matsumoto et al. ........ 437/60 |
| 5,527,729 A | * | 6/1996 | Matsumoto et al. ........ 437/60 |
| 5,804,458 A | | 9/1998 | Tehrani et al. |
| 5,838,608 A | | 11/1998 | Zhu et al. |
| 6,024,885 A | * | 2/2000 | Pendharkar et al. ........ 216/22 |
| 6,169,686 B1 | * | 1/2001 | Brug et al. ................. 365/171 |
| 6,236,590 B1 | * | 5/2001 | Bhattacharyya et al. .... 365/173 |
| 6,480,412 B1 | * | 11/2002 | Bessho et al. .............. 365/173 |
| 6,528,326 B1 | * | 3/2003 | Hiramoto et al. ........... 438/3 |
| 6,541,316 B2 | * | 4/2003 | Toet et al. ................ 438/166 |
| 2002/0081786 A1 | * | 6/2002 | Toet et al. ................ 438/166 |
| 2003/0047728 A1 | * | 3/2003 | Chen ......................... 257/10 |
| 2003/0067043 A1 | * | 4/2003 | Zhang ....................... 257/390 |
| 2003/0068897 A1 | * | 4/2003 | Yates ........................ 438/710 |

FOREIGN PATENT DOCUMENTS

| | | |
|---|---|---|
| DE | 101 13 853 A1 | 10/2000 |
| EP | 0 918 334 A2 | 5/1999 |

OTHER PUBLICATIONS

Jeong et al. "Fully integrated 64 kb mram with nvoel reference cell scheme" Electron devices metting 2002 IEDM '02 digest. international Dec. 8–11, 2002, p. 551–554.*

Y.Z. Hu et al.: Chemical–mechanical polishing as an enabling technoloy for giant magnetoresistance devices, *Thin Solid Films*, No. 308–309, 1997, pp. 555–561.

* cited by examiner

*Primary Examiner*—Caridad Everhart
*Assistant Examiner*—Granvill D Lee, Jr.
(74) *Attorney, Agent, or Firm*—Laurence A. Greenberg; Werner H. Stemer; Ralph E. Locher

(57) ABSTRACT

To simplify a method for manufacturing a memory device having a multiplicity of MRAM cells in a crossing area of conductor elements, a method for manufacturing a semiconductor circuit system, in particular, a memory device or the like, having a plurality of memory cells includes the step of structuring each of the memory elements simultaneously with the structuring of the first and second conductor elements.

51 Claims, 3 Drawing Sheets

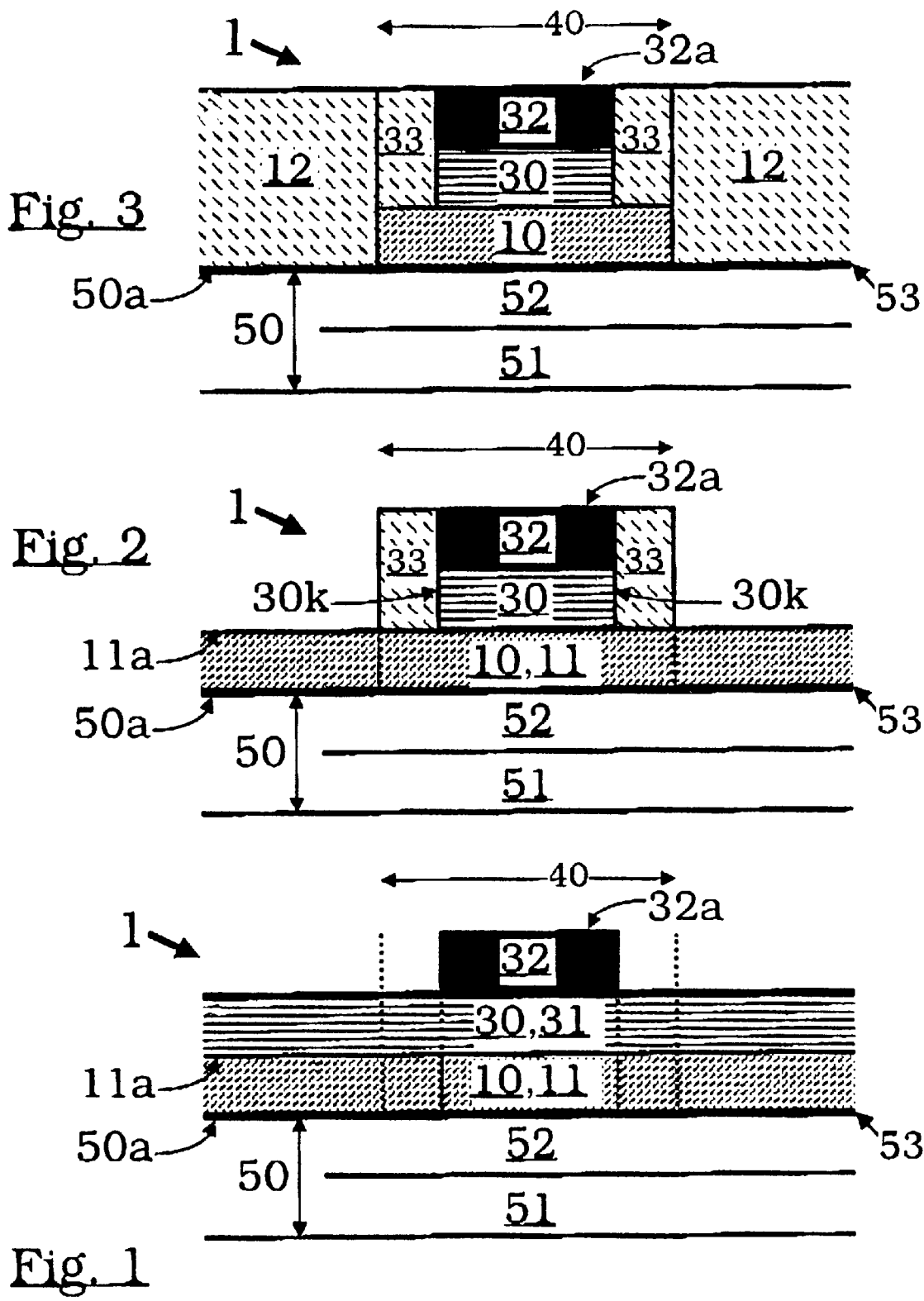

METHOD FOR MANUFACTURING A SEMICONDUCTOR CIRCUIT SYSTEM

BACKGROUND OF THE INVENTION

Field of the Invention

The invention relates to a method for manufacturing a semiconductor circuit system, in particular, a memory device or the like, having a plurality of memory cells, in particular Magneto-Resistive Random Access Memory ("MRAM") cells or the like, in which at least one circuit element is situated in a crossing area of at least two conductor elements and is situated therebetween.

In many semiconductor circuit systems, circuit elements are provided at crossing areas of two conductor elements (e.g., metallic printed conductors or the like), e.g., also between the conductor elements. Such a configuration is true, for example, for a multiplicity of memory devices or the like, and, in particular, for memory cells based on what are referred to as MRAM cells. In what are referred to as crosspoint MRAM cells, between each two crossed metallic conductors, the memory elements are provided in the form of what are called tunnel magneto-resistive or tunnel magneto-resistance ("TMR") layer stacks, having very small dimensions.

In the manufacturing of semiconductor circuit systems, these systems are often built up successively in layers. There is a difficulty that, in particular, in situating circuit elements in crossing areas of conductor elements, due to the frequently very small dimensions, a high degree of geometric precision and reproducibility can be achieved only at a relatively great expense. The geometric precision and reproducibility is, however, necessary to ensure, e.g., in MRAM cells, a corresponding reproducibility also of the magnetic properties of the memory cells.

In prior art methods, the circuit elements, and, thus, in particular, the TMR stacked layers, are processed by separate lithography steps and lithography planes. As such, after the application of a first class of conductor elements or printed conductors B likewise in the context of a separate lithography layer with a separate lithography step B, the circuit elements, e.g. the MRAM cells, are then subsequently formed in a separate segment of the process. Subsequently, the conductor elements or printed conductors of the second class are then likewise structured in a separate lithography step.

SUMMARY OF THE INVENTION

It is accordingly an object of the invention to provide a method for manufacturing a semiconductor circuit system that overcomes the hereinafore-mentioned disadvantages of the heretofore-known devices and methods of this general type and that enables structuring of circuit elements with a high degree of geometrical precision in a particularly simple and, at the same time, reliable manner.

With the foregoing and other objects in view, there is provided, in accordance with the invention, a method for manufacturing a semiconductor circuit system having a plurality of memory cells in which at least one circuit element is disposed substantially in a crossing area of at least two conductor elements and between the conductor elements, including the steps of forming at least one substrate region with a surface region having an upper side, forming at least one first conductor element and at least one second conductor element substantially on the surface region, the first conductor element and the second conductor element having at least one crossing area, the first conductor element having a first side facing away from the substrate region, and the second conductor element having a second side facing the substrate region, forming at least one circuit element substantially in the crossing area and between the first side and the second side, structuring the circuit element at least partially simultaneously with a structuring of at least one of the first and second conductor elements in a first etching step for the first conductor elements and a respective first part of the circuit element, executing the first etching step in substeps including a first etching substep, in which the respective first part of the circuit element is structured up to a surface of a first metallic layer for the first conductor element and subsequently resulting edge regions of the first part of the circuit element are passivated through oxide deposition using a spacer technique, and a second etching substep, in which the first conductor element is respectively structured up to the upper side of the substrate region to produce a substantially common, flush, vertically extending edge of the first conductor element and the passivation.

In the general method for manufacturing a semiconductor circuit system, in particular, a memory device or the like, having a multiplicity of memory cells, in particular, MRAM cells or the like, in which at least one circuit element is situated substantially in a crossing area of two conductor elements, between these elements, first a substrate region is formed. At least one first and one second conductor element are then formed on a surface area of the substrate region, so as to have at least one crossing area, whereby at least one circuit element is primarily formed between a side, facing away from the substrate region, of the first conductor elements and a side, facing the substrate region, of the second conductor element, primarily in the crossing area of the conductor elements.

In the inventive method for manufacturing a semiconductor circuit system, at least the formation, and, in particular, the structuring, of the respective circuit element is carried out, at least partially, at substantially the same time as and/or together with the formation, and, in particular, the structuring, of the first and/or second conductor element.

It is, thus, a basic idea of the invention to form the circuit elements of the semiconductor circuit system that are to be formed in crossing areas of the conductor elements, not in the context of a separate manufacturing step, but rather at the same time as and/or together with the conductor elements themselves. Thus, the process steps required for the formation of the conductor elements are made, at least in part, useful for the formation of the circuit elements themselves as well. As such, conventional manufacturing steps that are to be provided separately, and also the corresponding apparatuses, are omitted. As a result, the manufacturing method for the semiconductor circuit system is considerably simplified, which results in a savings of time and costs in manufacturing. In addition, certain adjustment or alignment difficulties and geometrical imprecisions in the formation of the corresponding positions of the circuit elements in the crossing areas of the conductor elements are avoided because the circuit elements are structured in one stroke, so to speak, with the conductor elements, in a self-adjusting process.

The inventive method is particularly preferred for manufacturing a semiconductor circuit system in the area of semiconductor memory devices, in particular, based on MRAM cells. Accordingly, memory elements are formed as circuit elements, in particular, as TMR stacks of an MRAM cell or the like.

In the formation of the substrate region, a semiconductor region is preferably formed having an insulating region and a corresponding Complementary Metal-Oxide Semiconductor ("CMOS") structure. The system having the plurality of first and second conductor elements and having the corresponding circuit elements is then correspondingly provided on the substrate region formed as such.

In accordance with another mode of the invention, for the formation of the first conductor elements, first a first material layer or metallic layer is applied primarily on the upper side of the substrate region, in particular, over a large area or over the entire surface or in two-dimensional form, and/or, in particular, using aluminum or the like. In addition, an adhesive layer and/or diffusion barrier can also be provided on the upper side of the substrate region, e.g., through the deposition of titanium nitride (TiN).

Because the geometry is decisive for ensuring the reproducibility and comparability of the electromagnetic properties of the circuit elements, in accordance with a further mode of the invention, the first material layer or metallic layer for the first conductor elements is planarized, in particular, through polishing, a chemical-mechanical polishing ("CMP") method, or the like.

In addition, it is preferred that a material layer for the circuit elements is deposited on the first material layer or metallic layer for the first conductor elements. The deposition preferably takes place over a large area or over the entire surface, or in two-dimensional form, and/or, in particular, in the form of what are referred to as TMR stacks or the like.

To form the first conductor elements on the surface area of the substrate region, first, a first mask, in particular, a hard mask, preferably made of silicon nitride (SiN), is formed on the material layer for the circuit elements. The mask can, for example, be a strip mask that is standard for conductor elements or for printed conductors. It is then provided that subsequently, in a first etching step, the first conductor elements and, substantially simultaneously therewith, at least a first part of the circuit elements are structured. The step preferably takes place along the extension of the first mask, i.e., in particular, along the strip direction. In addition, if necessary, filling then subsequently takes place with an intermediate insulating region, in particular, with an oxide, to mechanically stabilize the structure thus obtained, and to achieve an electrical insulation, required for operation, in the lateral direction. The filling takes place, in particular, so as to terminate at the upper side of the first mask.

In many circuit elements of semiconductor circuit devices, it is necessary to protect particular surface areas or edge regions that extend substantially vertically, and to stabilize these regions mechanically and passivate them. In accordance with an added mode of the invention for manufacturing a semiconductor circuit system, the first etching step is carried out in substeps. Here, first, in a first etching substep the first part of the circuit element is structured up to the surface of the first material layer or metallic layer for the first conductor element. Subsequently, resulting edge regions of the structured first part of the circuit element are passivated. The passivation preferably takes place through oxide deposition, e.g., using a spacer technique. Subsequently, in a second etching substep, the first conductor element is respectively structured up to the surface or upper side of the substrate region. It is preferred that there results a substantially flush, vertically extending common edge of the first conductor element and the passivation of the part of the circuit element.

Overall, this means, for example, that in the first etching substep up to the surface of the first material layer for the first conductor element, a relatively narrow web or ridge or a relatively narrow conductor element is etched free, in particular, in the form of a TMR stack. Subsequently, the edges of the stack are correspondingly passivated through a spacer deposition, and are, thus, mechanically stabilized and protected. The spacer so deposited thereby has only a slight lateral extension, and covers only the lateral regions or edge regions of the structured part of the circuit element. Subsequently, a broader conductor element, which covers the first etched conductor element, is etched into the first material layer, down to the surface of the substrate region, for the first conductor element. As such, there results on the upper side of the substrate region a linear configuration of stacks, whereby each stack is formed by a material layer for the first conductor element, a subsequent material layer, which is narrower, for the structured first part of the circuit elements, and a mask layer, likewise narrow, situated thereon. The spacer passivates the lateral regions or edge regions of the material layer for the circuit element and the masking layer, whereby the spacers terminate laterally flush with the material layer for the first conductor elements.

Advantageously, the first mask, situated on the material layer for the circuit element, is subsequently deposited for further processing. As such, a necessary contacting of the circuit element or of a part thereof is made possible between the first and second conductor element because, as a rule, the hard mask has a substantially electrically insulating effect.

In accordance with an additional mode of the invention, the first mask is subsequently removed, preferably, with a further etching step. In particular, the removing step is outside the crossing area.

In accordance with yet another mode of the invention, a second material layer or a metallic layer are deposited to form the second conductor element after the formation of the first conductor element and of the respective first part of the circuit element.

The formation of the second conductor elements advantageously takes place after the formation of the first conductor elements and of the corresponding part of the circuit elements. To form the second conductor elements, first a second material layer or metallic layer is deposited. The deposition takes place, in particular, over a large surface or over the entire surface, or in two-dimensional form, and/or, in particular, using aluminum or the like. According to the preceding structuring for the first conductor elements and for the first part of the circuit elements, the deposition of the second material layer for the second conductor elements can, for example, take place on the common embedding intermediate insulating layer.

In accordance with yet a further mode of the invention, if necessary, the second material layer or metallic layer for the second conductor elements is planarized, in particular, through polishing, a CMP method, or the like.

Advantageously, for the formation of the second conductor elements and/or of a further part of the circuit elements, subsequently a second mask, in particular, a hard mask, preferably made of silicon nitride (SiN) or the like, is first formed. The mask can also again be a strip mask, whereby the direction of the strips is then preferably different from the direction of the strips of the first mask, which, in particular, stands substantially perpendicular thereon. In addition, in a second etching step, the second conductor elements, and, substantially simultaneously therewith, second parts of the circuit elements, are then subsequently structured. The structuring preferably takes place along the extension of the second mask, in particular, along the strip direction of the second mask. In addition, if necessary, an intermediate insulating region can be applied for filling, in particular, in the form of an intermediate oxide layer, and/or, in particular, terminating at the upper side of the second mask, or the upper side of the material layer of the second conductor elements.

In accordance with yet an added mode of the invention the second etching step is executed in substeps including a first etching substep, in which the second conductor element is structured up to a surface of the intermediate insulating region and a second etching substep, in which the second part of the respective circuit element is subsequently structured up to the first side of the first conductor element.

As in the first etching step, for reasons of a preparation that is not destructive, in particular, of the edge regions or lateral regions of the circuit elements, the second etching step can also be executed in substeps. Here, in a first etching substep, the second material layer or second metallic layer for the second conductor elements is preferably etched up to the surface of the material layer for the circuit elements or up to the surface of the first mask. In a second etching substep, the material layer for the circuit elements, thus, in particular, the TMR stack is then etched up to the surface of the first conductor elements, with a somewhat greater width if necessary, whereby, if necessary, the edge regions or side regions of the parts of the circuit elements so structured are then again passivated and protected using a spacer technique.

Subsequently, if necessary, filling again advantageously takes place with an intermediate insulating area, in particular, with an intermediate oxide or the like, and/or, in particular, terminating at the level of the upper side of the second mask or the upper side of the second conductor elements.

Advantageously, a strip mask is used in the structuring of the first and second conductor elements, whereby the strip directions are advantageously different, and, in particular, are substantially perpendicular to one another.

Further aspects of the invention are set forth in the following text.

The TMR layer stack, situated between two crossed metallic conductors or printed conductors in crosspoint MRAM cells, must be formed and structured with very small dimensions, yet with a high degree of geometrical precision. The features are important with respect to the reproducibility of the magnetic properties.

In conventional manufacturing processes, the TMR layer is exposed and structured in the context of a separate lithography step with a separate lithography layer. On one hand, the lithography of small individual structures is very difficult, and is expensive within the overall process. In addition, unavoidable imprecisions result during adjustment. On the other hand, the relative position of the TMR stack to the metallic conductors or printed conductors depends strongly on the adjustment tolerances. These tolerances are typically approximately one-third of the maximum resolution.

In the method according to the invention, the manufacturing process is based on a metallization scheme in which the metallic conductors are etched. This typically takes place as in an aluminum metallization. Here, the TMR stack is executed completely and so as to be self-adjusted to the metallic conductors, as was described above, in that the structuring of the TMR stack is executed at least partially simultaneously and/or together with the structuring of the metallic conductors.

Thus, according to the invention, the standard adjustment imprecisions between the metallic conductors and the TMR element are advantageously omitted. In addition, rectangular cells having a geometry that can be well-controlled are formed. The omission of an additional lithography layer and of a corresponding very critical mask results in a reduction in costs. Steps with strip masking, which further simplify the manufacturing process, remain as simple lithography layers or lithography steps.

Other features that are considered as characteristic for the invention are set forth in the appended claims.

Although the invention is illustrated and described herein as embodied in a method for manufacturing a semiconductor circuit system, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary cross-sectional view of a first intermediate state for a semiconductor circuit system according to the invention;

FIG. 2 is a fragmentary cross-sectional view of a subsequent intermediate state for the semiconductor circuit system of FIG. 1;

FIG. 3 is a fragmentary cross-sectional view of a subsequent intermediate state for the semiconductor circuit system of FIG. 2;

DESCRIPTION OF THE PREFERRED EMBODIMENTS

Figure 5:
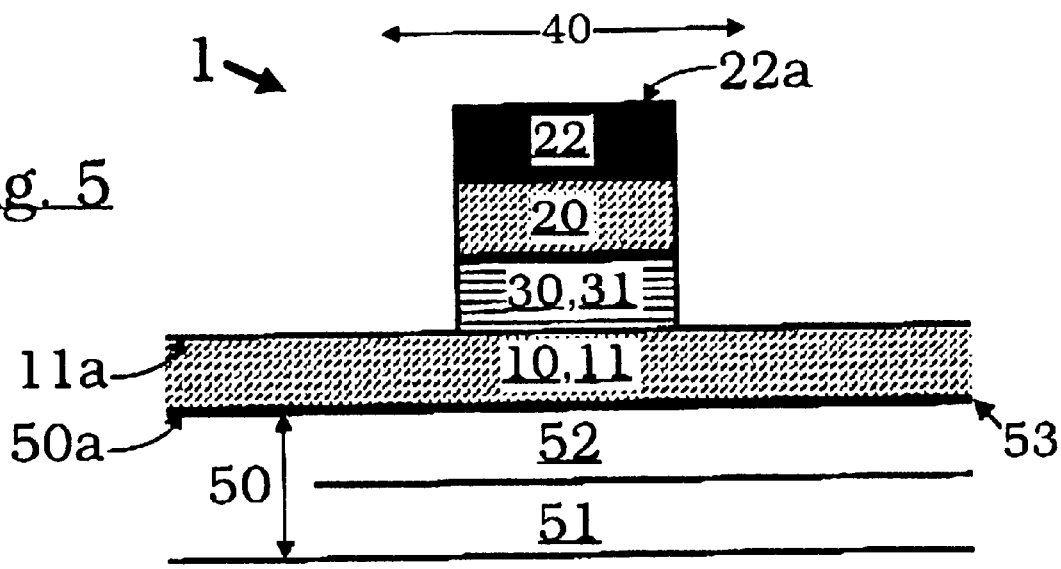
FIG. 5 is a fragmentary cross-sectional view of a subsequent intermediate state for the semiconductor circuit system of FIG. 4.
Figure 4:
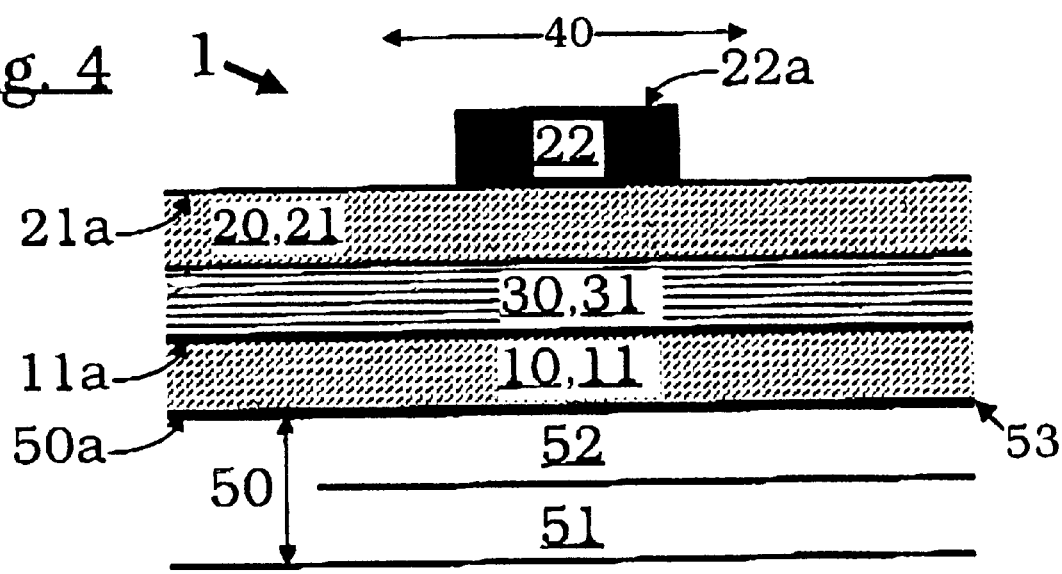
FIG. 4 is a fragmentary cross-sectional view of a subsequent intermediate state for the semiconductor circuit system of FIG. 3 along a different direction of view.
Figure 6:
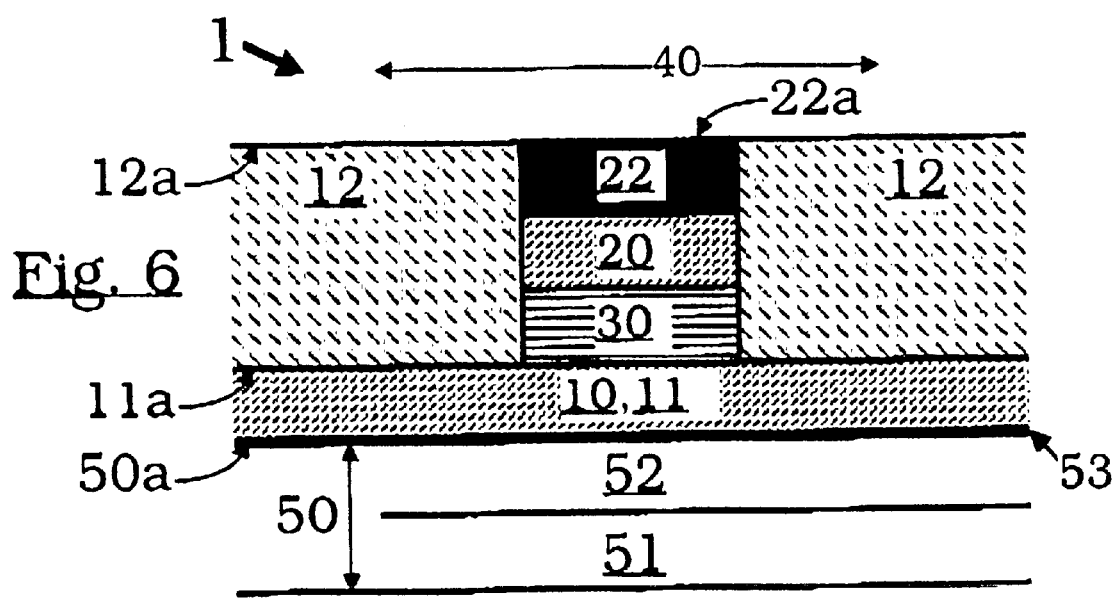
FIG. 6 is a fragmentary cross-sectional view of a subsequent intermediate state for the semiconductor circuit system of FIG. 5.

Referring now to the figures of the drawings in detail and first, particularly to FIGS. 1 to 6 thereof, there is shown various stages in the manufacture of a semiconductor circuit system 1 in the context of a specific embodiment of the inventive method. FIGS. 1 to 3 are viewed in a direction along a first conductor element 10 to be formed, while FIGS. 4 to 6 are viewed along a second conductor element 20 to be formed.

FIG. 1 shows, in a lateral, cross-sectional view, a first intermediate stage in the manufacture of a semiconductor circuit system 1 according to the specific embodiment of the inventive method. Formed substrate region 50, having surface or upper side 50a, is constructed layer-by-layer, with the actual semiconductor substrate 51, an insulating region 52 provided thereupon, and an adhesive layer and diffusion barrier 53 made, e.g., of titanium nitride (TiN), situated thereupon. On surface or upper side 50a of substrate region 50, a first material layer 11 or metallization layer 11 for first conductor element 10 to be formed is then first formed in two-dimensional form, and, subsequently, a material layer 31 for circuit elements 30 to be formed is formed on upper side 11a thereof.

A first mask 32 having upper side 32a is subsequently deposited (e.g., in the form of a silicon nitride hard mask or the like) in crossing areas 40 to be provided for first and second conductor elements 10 and 20 to be formed overall.

In the transition to the intermediate state shown in FIG. 2, in semiconductor circuit system 1, a first etching substep is carried out up to the surface or upper side 11a of first material layer 11 to form, according to deposited first mask 32, a first part for circuit element 30. Subsequently, corresponding passivations 33 are deposited at edge regions 30k using a spacer technique, in particular in order to protect lateral or edge regions 30k of circuit elements 30.

In the transition to the intermediate state shown in FIG. 3, in a second etching substep the first material layer or metallic layer 11 for first conductor elements 10 is etched down to upper side 50a of substrate region 50 to be flush with the lateral extension of passivations 33 of circuit elements 30 in crossing area 40 to be formed. FIG. 3 shows the intermediate state after filling with a corresponding intermediate insulating layer 12 or intermediate oxide layer 12 up to surface 32a of first mask 32.

FIGS. 4 to 6 show further subsequent intermediate stages in the manufacture of semiconductor circuit system 1 according to the method of the invention, likewise in the form of lateral cross-sectional views, but viewed in the direction of a second conductor device 20 to be formed.

Based upon the intermediate state shown in FIG. 3, in the transition to the intermediate state shown in FIG. 4, first mask 32 is first completely removed, and then a second material layer 21 or second metallization layer 21 having upper side 21a is deposited and is correspondingly planarized for second conductor elements 20 to be formed. Subsequently, a second mask 22 is then deposited on upper side 21a of second material layer 21 or metallization layer 21, so that a corresponding overlap results, in particular, in crossing areas 40 to be formed.

A further etching substep is subsequently executed, in which the regions not covered by the second mask 22 of second metallization layer 21 and material layer 11 for circuit elements 10 were removed down to surface 11a of first material layer 11 or metallic layer 11. Such a state is shown in FIG. 5.

In transition to FIG. 6, an embedding in an intermediate insulating region 12, terminating at upper side 22a of second mask 22, is subsequently carried out.

Figure 7:
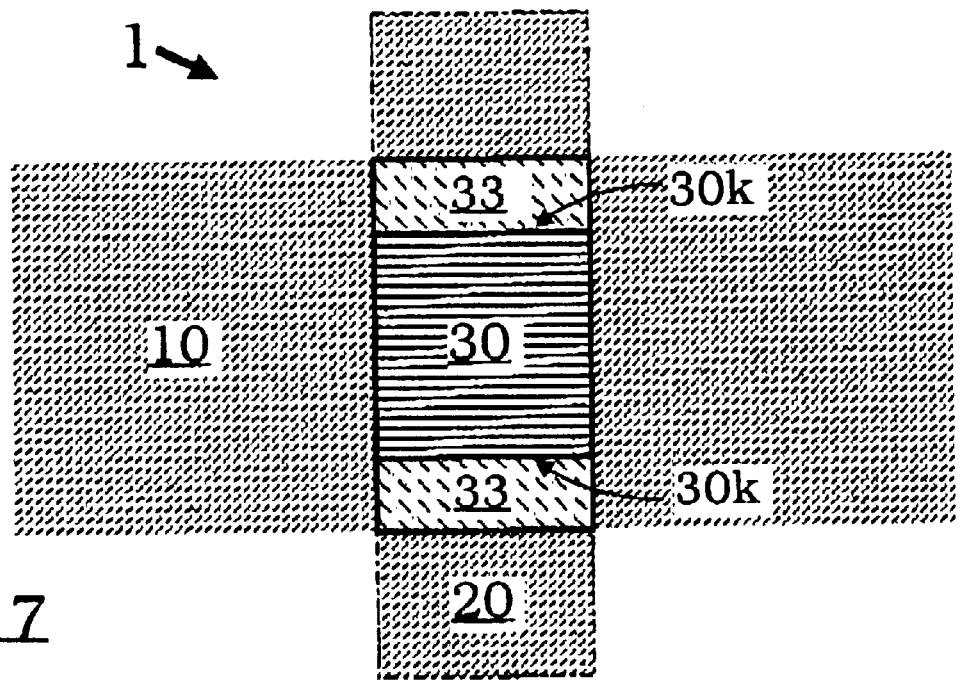
FIG. 7 is a fragmentary, cross-sectional and plan view of the semiconductor circuit system of FIGS. 1 to 6 after completion of the method according to the invention.

FIG. 7 shows, in a schematic and partially cross-sectional top view, the final state in the manufacturing of the semiconductor circuit system 1 in the crossing area 40 of two conductor elements 10 and 20. In the crossing area 40, a circuit element 30 is formed in the form of a TMR stack of an MRAM cell, passivation elements 33 being provided for the protection of edge regions 30k of circuit element 30.

I claim:

1. A method for manufacturing a semiconductor circuit system having a plurality of memory cells in which at least one circuit element is disposed substantially in a crossing area of at least two conductor elements and between the conductor elements, which comprises:

forming at least one substrate region with a surface region having an upper side;

forming at least one first conductor element and at least one second conductor element substantially on the surface region, the first conductor element and the second conductor element having at least one crossing area, the first conductor element having a first side facing away from the substrate region, and the second conductor element having a second side facing the substrate region;

forming at least one circuit element substantially in the crossing area and between the first side and the second side;

structuring the circuit element at least partially simultaneously with a structuring of at least one of the first and second conductor elements in a first etching step for the first conductor elements and a respective first part of the circuit element;

executing the first etching step in substeps including:
a first etching substep, in which:
the respective first part of the circuit element is structured up to a surface of a first metallic layer for the first conductor element; and
subsequently resulting edge regions of the first part of the circuit element are passivated through oxide deposition using a spacer technique; and
a second etching substep, in which the first conductor element is respectively structured up to the upper side of the substrate region to produce a substantially common, flush, vertically extending edge of the first conductor element and the passivation.

2. The method according to claim 1, which further comprises forming a memory element as the circuit element.

3. The method according to claim 1, which further comprises forming a TMR stack of an MRAM cell as the circuit element.

4. The method according to claim 1, which further comprises carrying out the substrate region forming step by forming a semiconductor region having:
an insulating region; and
a CMOS structure.

5. The method according to claim 1, which further comprises forming the first conductor element by applying one of a first material layer and a metallic layer on the upper side of the substrate region.

6. The method according to claim 5, which further comprises planarizing the one of the first material layer and the metallic layer.

7. The method according to claim 6, which further comprises carrying out the planarizing step by one of the group consisting of polishing and a CMP method.

8. The method according to claim 5, which further comprises depositing a material layer for the circuit element on one of the first material layer and the metallic layer as a TMR stack.

9. The method according to claim 8, which further comprises:
forming a first mask on the material layer for the circuit element, the first mask having an extension; and
in the first etching step, structuring the first conductor element and, substantially simultaneously therewith, the respective first part of the circuit element along the extension of the first mask.

10. The method according to claim 9, wherein the first mask is a hard mask.

11. The method according to claim 9, wherein the first mask is of silicon nitride.

12. The method according to claim 9, which further comprises filling with an intermediate insulating region.

13. The method according to claim 12, which further comprises carrying out the filling step with an oxide.

14. The method according to claim 12, wherein the first mask has an upper side, and which further comprises carrying out the filling step by terminating the filling at the upper side of the first mask.

15. The method according to claim 9, which further comprises subsequently removing the first mask.

16. The method according to claim 15, which further comprises carrying out the removing step with a further etching step.

17. The method according to claim 15, which further comprises carrying out the removing step outside the crossing area.

18. The method according to claim 1, which further comprises forming the first conductor element by applying one of a first material layer and a metallic layer on the upper side of the substrate region using aluminum.

19. The method according to claim 18, which further comprises depositing a material layer for the circuit element on one of the first material layer and the metallic layer as a TMR stack.

20. The method according to claim 1, which further comprises forming the first conductor element by applying one of a first material layer and a metallic layer substantially over a surface of the substrate region.

21. The method according to claim 20, which further comprises depositing a material layer for the circuit element over a substantial portion of a surface of one of the first material layer and the metallic layer as a TMR stack.

22. The method according to claim 1, which further comprises forming the first conductor element by applying one of a first material layer and a metallic layer over an entire surface of the substrate region.

23. The method according to claim 22, which further comprises depositing a material layer for the circuit element over an entire surface of one of the first material layer and the metallic layer as a TMR stack.

24. The method according to claim 1, which further comprises forming the first conductor element by applying one of a first material layer and a metallic layer in two-dimensional form of the substrate region.

25. The method according to claim 24, which further comprises depositing a material layer for the circuit element in two-dimensional form of one of the first material layer and the metallic layer as a TMR stack.

26. The method according to claim 1, which further comprises depositing one of a second material layer and a metallic layer to form the second conductor element after the formation of the first conductor element and of the respective first part of the circuit element.

27. The method according to claim 26, which further comprises depositing the one of the second material layer and the metallic layer over a substantial portion of a surface of the first conductor element.

28. The method according to claim 26, which further comprises depositing the one of the second material layer and the metallic layer over an entire surface of the first conductor element.

29. The method according to claim 26, which further comprises depositing the one of the second material layer and the metallic layer in two-dimensional form.

30. The method according to claim 26, wherein the deposition includes aluminum.

31. The method according to claim 26, which further comprises planarizing the one of the second material layer and the metallic layer.

32. The method according to claim 31, which further comprises carrying out the planarizing step by one of the group consisting of polishing and a CMP method.

33. The method according to claim 26, which further comprises forming a second mask.

34. The method according to claim 33, wherein the second mask is a hard mask.

35. The method according to claim 33, wherein the second mask is of silicon nitride.

36. The method according to claim 33, which further comprises, after forming the second mask, in a second etching step, structuring the second conductor element and, substantially simultaneously therewith, a second part of the circuit element.

37. The method according to claim 33, wherein the second mask has an extension, and which further comprises, after forming the second mask, in a second etching step, structuring the second conductor element and, substantially simultaneously therewith, a second part of the circuit element along an extension of the second mask.

38. The method according to claim 37, which further comprises filling with an intermediate insulating region.

39. The method according to claim 38, which further comprises carrying out the filling step by filling with an oxide.

40. The method according to claim 38, which further comprises carrying out the filling step by terminating the filling at an upper side of the second mask.

41. The method according to claim 40, which further comprises planarizing a surface of the second conductor element.

42. The method according to claim 41, which further comprises carrying out the planarizing step by one of the group consisting of polishing and a CMP method.

43. The method according to claim 42, which further comprises executing the second etching step in substeps including:
   a first etching substep, in which the second conductor element is structured up to a surface of the intermediate insulating region; and
   a second etching substep, in which the second part of the respective circuit element is subsequently structured up to the first side of the first conductor element.

44. The method according to claim 43, which further comprises filling with an intermediate insulating region after structuring the first conductor element, the second conductor element, and the circuit element.

45. The method according to claim 44, which further comprises carrying out the filling step by filling with an intermediate oxide.

46. The method according to claim 44, which further comprises carrying out the filling step by terminating the filling at one of the group consisting of:
   the upper side of the second mask; and
   the surface of the second conductor element.

47. The method according to claim 1, which further comprises utilizing strip masks having different strip directions to structure the first and second conductor elements.

48. The method according to claim 47, wherein the strip masks have strip directions substantially perpendicular to one another.

49. A method for manufacturing a semiconductor circuit system having a plurality of memory cells in which at least one circuit element is disposed substantially in a crossing area of at least two conductor elements and between the conductor elements, which comprises:
   forming at least one substrate region with a surface region having an upper side;

forming at least one first conductor element and at least one second conductor element substantially on the surface region, the first conductor element and the second conductor element having at least one crossing area, the first conductor element having a first side facing away from the substrate region, and the second conductor element having a second side facing the substrate region;

forming at least one circuit element substantially in the crossing area and between the first side and the second side;

structuring the circuit element together with a structuring of at least one of the first and second conductor elements in a first etching step for the first conductor elements and a respective first part of the circuit element;

executing the first etching step in substeps including:
 a first etching substep, in which:
  the respective first part of the circuit element is structured up to a surface of a first metallic layer for the first conductor element; and
  subsequently resulting edge regions of the first part of the circuit element are passivated through oxide deposition using a spacer technique; and
 a second etching substep, in which the first conductor element is respectively structured up to the upper side of the substrate region to produce a substantially common, flush, vertically extending edge of the first conductor element and the passivation.

50. A method for manufacturing a memory device having a plurality of MRAM memory cells in which at least one circuit element is disposed substantially in a crossing area of at least two conductor elements and between the conductor elements, which comprises:

forming at least one substrate region with a surface region having an upper side;

forming at least one first conductor element and at least one second conductor element substantially on the surface region, the first conductor element and the second conductor element having at least one crossing area, the first conductor element having a first side facing away from the substrate region, and the second conductor element having a second side facing the substrate region;

forming at least one circuit element substantially in the crossing area and between the first side and the second side;

structuring the circuit element at least partially simultaneously with a structuring of at least one of the first and second conductor elements in a first etching step for the first conductor elements and a respective first part of the circuit element;

executing the first etching step in substeps including:
 a first etching substep, in which:
  the respective first part of the circuit element is structured up to a surface of a first metallic layer for the first conductor element; and
  subsequently resulting edge regions of the first part of the circuit element are passivated through oxide deposition using a spacer technique; and
 a second etching substep, in which the first conductor element is respectively structured up to the upper side of the substrate region to produce a substantially common, flush, vertically extending edge of the first conductor element and the passivation.

51. A method for manufacturing a memory device having a plurality of MRAM memory cells in which at least one circuit element is disposed substantially in a crossing area of at least two conductor elements and between the conductor elements, which comprises:

forming at least one substrate region with a surface region having an upper side;

forming at least one first conductor element and at least one second conductor element substantially on the surface region, the first conductor element and the second conductor element having at least one crossing area, the first conductor element having a first side facing away from the substrate region, and the second conductor element having a second side facing the substrate region;

forming at least one circuit element substantially in the crossing area and between the first side and the second side;

structuring the circuit element together with a structuring of at least one of the first and second conductor elements in a first etching step for the first conductor elements and a respective first part of the circuit element;

executing the first etching step in substeps including:
 a first etching substep, in which:
  the respective first part of the circuit element is structured up to a surface of a first metallic layer for the first conductor element; and
  subsequently resulting edge regions of the first part of the circuit element are passivated through oxide deposition using a spacer technique; and
 a second etching substep, in which the first conductor element is respectively structured up to the upper side of the substrate region to produce a substantially common, flush, vertically extending edge of the first conductor element and the passivation.

* * * * *